US010127976B2

(12) United States Patent
Wang et al.

(10) Patent No.: US 10,127,976 B2
(45) Date of Patent: Nov. 13, 2018

(54) STATIC RANDOM ACCESS MEMORY CELL ARRAY, STATIC RANDOM ACCESS MEMORY CELL AND OPERATING METHOD THEREOF

(71) Applicant: NATIONAL CHUNG CHENG UNIVERSITY, Chia-Yi (TW)

(72) Inventors: Jinn-Shyan Wang, Chia-Yi (TW); Yung-Chen Chien, Chia-Yi (TW)

(73) Assignee: NATIONAL CHUNG CHENG UNIVERSITY, Chia-Yi (TW)

( * ) Notice: Subject to any disclaimer, the term of this patent is extended or adjusted under 35 U.S.C. 154(b) by 15 days.

(21) Appl. No.: 15/655,914

(22) Filed: Jul. 21, 2017

(65) Prior Publication Data

US 2018/0261277 A1 Sep. 13, 2018

(30) Foreign Application Priority Data

Mar. 10, 2017 (TW) .............................. 106108014 A

(51) Int. Cl.
*G11C 11/00* (2006.01)
*G11C 11/419* (2006.01)

(52) U.S. Cl.
CPC .................................. *G11C 11/419* (2013.01)

(58) Field of Classification Search
CPC .................................................... G11C 11/412
USPC ......................................................... 365/154
See application file for complete search history.

(56) References Cited

U.S. PATENT DOCUMENTS

2012/0014171 A1* 1/2012 Chuang ................. G11C 11/412
365/154

* cited by examiner

*Primary Examiner* — Hoai V Ho
(74) *Attorney, Agent, or Firm* — CKC & Partners Co., Ltd.

(57) ABSTRACT

A static random access memory cell includes a controlling signal line unit, a latch and an access transistor unit. The first bottom transistor unit is controlled by the controlling signal line unit to change voltage levels of the first pseudo node and the second pseudo node. The second bottom transistor unit is controlled by the first internal node to perform connection and disconnection between the controlling signal line unit and the second pseudo node, and the second bottom transistor unit is controlled by the second internal node to perform connection and disconnection between the controlling signal line unit and the first pseudo node. The access transistor unit is controlled by the controlling signal line unit to perform connection and disconnection between the controlling signal line unit, the first pseudo node and the second pseudo node.

20 Claims, 11 Drawing Sheets

STATIC RANDOM ACCESS MEMORY CELL ARRAY, STATIC RANDOM ACCESS MEMORY CELL AND OPERATING METHOD THEREOF

RELATED APPLICATIONS

This application claims priority to Taiwan Application Serial Number 106108014, filed Mar. 10, 2017, which is herein incorporated by reference.

BACKGROUND

Technical Field

The present disclosure relates to a static random access memory cell array, a static random access memory cell and an operating method thereof. More particularly, the present disclosure relates to the static random access memory cell array, the static random access memory cell and the operating method thereof which are capable of maintaining stability against read disturbance and half-selection disturbance simultaneously without sacrificing the write-ability so as to save drastic area overhead consumed by the pumping capacitor of voltage-boost write-assisted circuit.

Description of Related Art

Static random access memories (SRAMs) are generally used in applications requiring high speed, such as microprocessors and other data processing systems which use register files and memories for high speed computing. Each static random access memory cell stores one bit of data and is implemented as a pair of cross-coupled inverters which are stable in one of two possible voltage levels, and the logic state of the cell is determined with a pair of access transistors, thereby creating the basic six-transistor (6T) static random access memory architecture. The read stability and write ability of static random access memory cells have been improved by adding additional transistors to the basic 6T architecture, such as conventional 8T architectures. The conventional 8T architecture can provide single-ended read sensing, but such single-ended read sensing methods still suffer from bitline noise resulting from transients, process variations, soft error, and power supply fluctuations which may cause the cell to inadvertently change logic states. In addition, "soft error" represents that the memory array in operational state may be affected by the charged particles. This phenomenon will become more serious as the process shrinks and the operating voltage decreases. The soft error can be corrected by a specific correcting circuit. However, the specific correcting circuit will increase the complexity, hardware cost, and power consumption. In order to reduce the incidence of multi-bit soft errors, different bits can be interleavedly stored in the memory array to reduce the requirement of the specific correcting circuit, thereby reducing the hardware cost and power consumption.

On the other hand, a conventional 10T static random access memory cell uses additional transistors to avoid read and half-selection disturbances. However, the conventional 10T static random access memory cell is refined in pursuit of stability but sacrificing ability to write, thus requiring an additional technology to improve the problem. This type of additional technology, such as a voltage-boost write-assisted circuit, requires a pumping capacitor which occupies a huge area on the IC chips. Therefore, a static random access memory cell array, a static random access memory cell and an operating method thereof having the features of good stability and ability to write are commercially desirable.

SUMMARY

According to one aspect of the present disclosure, a static random access memory cell includes a controlling signal line unit, a latch and an access transistor unit. The latch is electrically connected to the controlling signal line unit. The latch has a first internal node, a second internal node, a first pseudo node and a second pseudo node. The latch includes a top transistor unit, an intermediate transistor unit, a first bottom transistor unit and a second bottom transistor unit. The top transistor unit is connected to the first internal node and the second internal node. The intermediate transistor unit is connected to the first internal node, the second internal node, the first pseudo node and the second pseudo node. The first bottom transistor unit is connected to the first pseudo node, the second pseudo node and the controlling signal line unit. The first bottom transistor unit is controlled by the controlling signal line unit to change voltage levels of the first pseudo node and the second pseudo node. The second bottom transistor unit is connected to the first internal node, the second internal node, the first pseudo node, the second pseudo node and the controlling signal line unit. The second bottom transistor unit is controlled by the first internal node to perform connection and disconnection between the controlling signal line unit and the second pseudo node, and the second bottom transistor unit is controlled by the second internal node to perform connection and disconnection between the controlling signal line unit and the first pseudo node. The access transistor unit is connected between the latch and the controlling signal line unit. The access transistor unit is controlled by the controlling signal line unit to perform connection and disconnection between the controlling signal line unit and the first pseudo node, and the access transistor unit is controlled by the controlling signal line unit to perform connection and disconnection between the controlling signal line unit and the second pseudo node.

According to another aspect of the present disclosure, a static random access memory cell array includes at least four static random access memory cells located on an upper left corner region, an upper right corner region, a lower left corner region and a lower right corner region, respectively. The two adjacent static random access memory cells are connected to each other, and each of the four static random access memory cells includes a controlling signal line unit, a latch and an access transistor unit. The latch is electrically connected to the controlling signal line unit. The latch has a first internal node, a second internal node, a first pseudo node and a second pseudo node. The latch includes a top transistor unit, an intermediate transistor unit, a first bottom transistor unit and a second bottom transistor unit. The top transistor unit is connected to the first internal node and the second internal node. The intermediate transistor unit is connected to the first internal node, the second internal node, the first pseudo node and the second pseudo node. The first bottom transistor unit is connected to the first pseudo node, the second pseudo node and the controlling signal line unit. The first bottom transistor unit is controlled by the controlling signal line unit to change voltage levels of the first pseudo node and the second pseudo node. The second bottom transistor unit is connected to the first internal node, the second internal node, the first pseudo node, the second pseudo node and the controlling signal line unit. The second bottom transistor unit is controlled by the first internal node and the second internal node to perform connection and disconnection between the controlling signal line unit and the second pseudo node. The second bottom transistor unit is controlled by the second internal node to perform connection and disconnection between the controlling signal line unit and the first pseudo node. The access transistor unit is connected between the latch and the controlling signal line unit. The access transistor unit is controlled by the controlling signal line unit to perform connection and disconnection between the controlling signal line unit and the first pseudo node, and the access transistor unit is controlled by the controlling signal line unit to perform connection and disconnection between the controlling signal line unit and the second pseudo node.

According to further another aspect of the present disclosure, an operating method of the static random access memory cell includes a voltage level applying step. The voltage level applying step is for applying a plurality of voltage levels to a virtual ground line, a first bit line, a second bit line, a first word line and a second word line, respectively. The controlling signal line unit includes the virtual ground line, the first bit line, the second bit line, the first word line and the second word line. The static random access memory cell is controlled by the controlling signal line unit to enter an operational state.

BRIEF DESCRIPTION OF THE DRAWINGS

The present disclosure can be more fully understood by reading the following detailed description of the embodiment, with reference made to the accompanying drawings as follows.

DETAILED DESCRIPTION

Before describing any embodiments in detail, some terms used in the following are described. A voltage level of "1" represents that the voltage is equal to a voltage source VDD. The voltage level of "0" represents that the voltage is equal to a ground voltage GND. A PMOS transistor and an NMOS transistor represent a P-type MOS transistor and an N-type MOS transistor, respectively. Each transistor has a source, a drain and a gate. A row direction represents a horizontal direction. A column direction represents a vertical direction.

Figure 1:
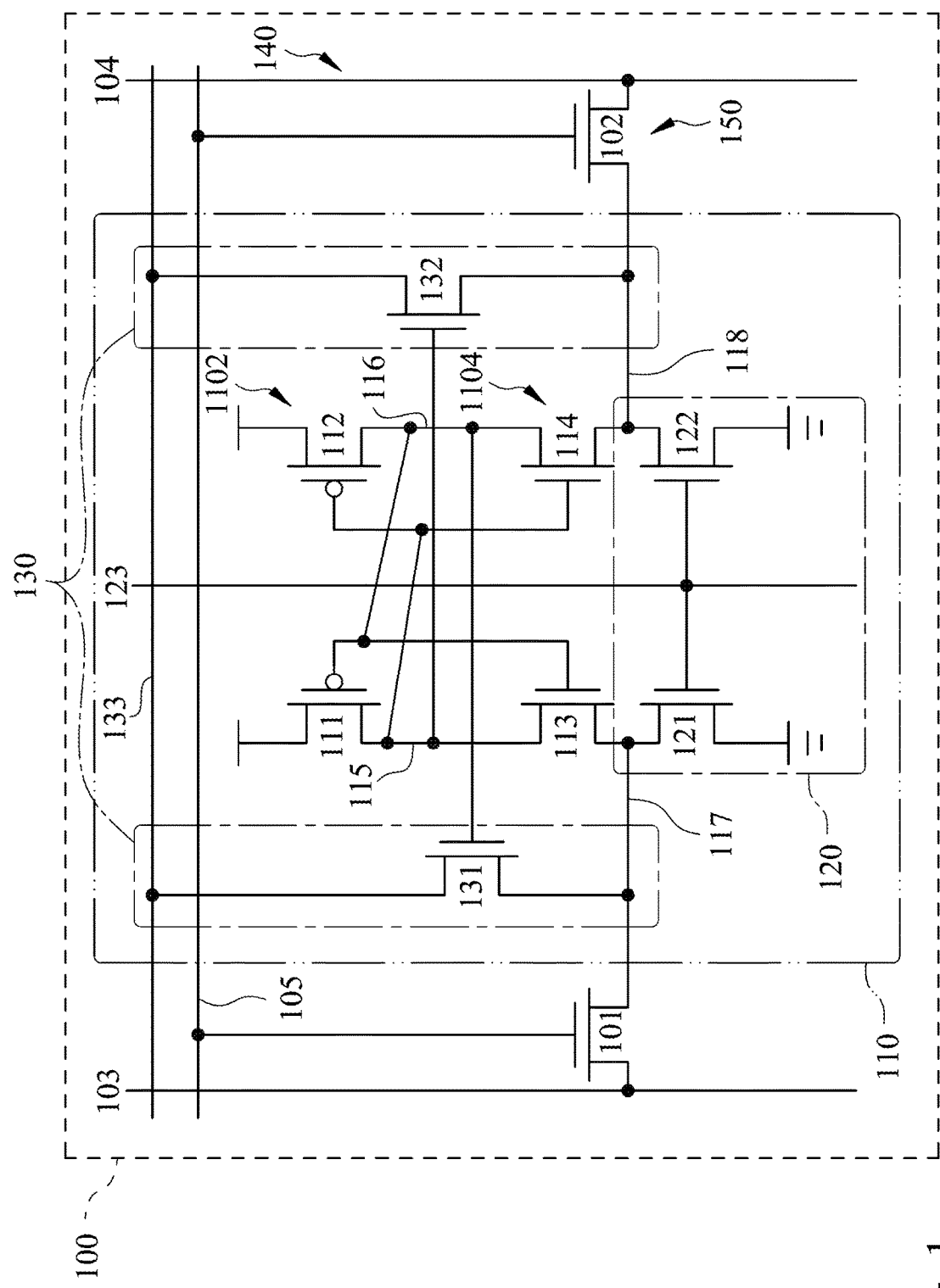
FIG. 1 shows a circuit diagram of a static random access memory cell according to one embodiment of the present disclosure.

FIG. 1 shows a circuit diagram of a static random access memory cell 100 according to one embodiment of the present disclosure. The static random access memory cell 100 is suitable for use in a bit-interleaving memory array to maintain stability and ability to write. The static random access memory cell 100 includes a latch 110, a controlling signal line unit 140, and an access transistor unit 150.

The latch 110 is electrically connected to the controlling signal line unit 140 and the access transistor unit 150. The latch 110 has a first internal node 115, a second internal node 116, a first pseudo node 117 and a second pseudo node 118. The latch 110 includes a top transistor unit 1102, an intermediate transistor unit 1104, a first bottom transistor unit 120 and a second bottom transistor unit 130. The top transistor unit 1102 is connected to the first internal node 115 and the second internal node 116. The top transistor unit 1102 includes a first top transistor 111 and a second top transistor 112. The first top transistor 111 has a first top gate, a first top drain and a first top source. The first top gate is connected to the second internal node 116. The first top drain is connected to the first internal node 115, and the first top source is connected to the voltage source VDD. The first top transistor 111 is a PMOS transistor. The second top transistor 112 is corresponding to the first top transistor 111 and has a second top gate, a second top drain and a second top source. The second top gate is connected to the first internal node 115. The second top drain is connected to the second internal node 116, and the second top source is connected to the voltage source VDD. The second top transistor 112 is a PMOS transistor. Moreover, the intermediate transistor unit 1104 is connected to the first internal node 115, the second internal node 116, the first pseudo node 117 and the second pseudo node 118. The intermediate transistor unit 1104 includes a first intermediate transistor 113 and a second intermediate transistor 114. The first intermediate transistor 113 has a first intermediate gate, a first intermediate drain and a first intermediate source. The first intermediate gate is connected to the second internal node 116, i.e., the first intermediate gate is connected to the first top gate of the first top transistor 111. The first intermediate drain is connected to the first internal node 115, i.e., the first intermediate drain is connected to the first top drain of the first top transistor 111. The first intermediate source is connected to the first pseudo node 117. The first intermediate transistor 113 is an NMOS transistor. The second intermediate transistor 114 is corresponding to the first intermediate transistor 113 and has a second intermediate gate, a second intermediate drain and a second intermediate source. The second intermediate gate is connected to the first internal node 115, i.e., the first intermediate gate is connected to the second top gate of the second top transistor 112. The second intermediate drain is connected to the second internal node 116, i.e., the second intermediate drain is connected to the second top drain of the second top transistor 112. The second intermediate source is connected to the second pseudo node 118. The second intermediate transistor 114 is an NMOS transistor.

The first bottom transistor unit 120 is connected to the first pseudo node 117, the second pseudo node 118 and the controlling signal line unit 140. The first bottom transistor unit 120 is controlled by the controlling signal line unit 140 to change voltage levels of the first pseudo node 117 and the second pseudo node 118. In detail, the first bottom transistor unit 120 includes a first bottom transistor 121 and a second bottom transistor 122. The first bottom transistor 121 has a first bottom gate, a first bottom drain and a first bottom source. The first bottom gate is connected to the second word line 123 of the controlling signal line unit 140. The first bottom drain is connected to the first pseudo node 117, and the first bottom source is connected to a ground voltage VSS. The first bottom transistor 121 is an NMOS transistor. In addition, the second bottom transistor 122 is corresponding to the first bottom transistor 121 and has a second bottom gate, a second bottom drain and a second bottom source. The second bottom gate is connected to the second word line 123 of the controlling signal line unit 140. The second bottom drain is connected to the second pseudo node 118, and the second bottom source is connected to the ground voltage VSS. The second bottom transistor 122 is an NMOS transistor. Hence, the first bottom transistor unit 120 is responsible for avoiding haft-selection disturbances in the bit-interleaving memory array.

The second bottom transistor unit 130 is connected to the first internal node 115, the second internal node 116, the first pseudo node 117, the second pseudo node 118 and the controlling signal line unit 140. The second bottom transistor unit 130 is controlled by the first internal node 115 to perform connection and disconnection between the controlling signal line unit 140 and the second pseudo node 118, and the second bottom transistor unit 130 is controlled by the second internal node 116 to perform connection and disconnection between the controlling signal line unit 140 and the first pseudo node 117. In detail, the second bottom transistor unit 130 includes a first feet transistor 131 and a second feet transistor 132. The first feet transistor 131 has a first feet gate, a first feet drain and a first feet source. The first feet gate is connected to the second internal node 116. The first feet drain is connected to the first pseudo node 117, and the first feet source is connected to a virtual ground line 133 of the controlling signal line unit 140. The first feet transistor 131 is an NMOS transistor. Moreover, the second feet transistor 132 is corresponding to the first feet transistor 131 and has a second feet gate, a second feet drain and a second feet source. The second feet gate is connected to the first internal node 115. The second feet drain is connected to the second pseudo node 118, and the second feet source is connected to the virtual ground line 133 of the controlling signal line unit 140. The second feet transistor 132 is an NMOS transistor. Therefore, the second bottom transistor unit 130 is responsible for processing the operation of one foot of the static random access memory cell 100.

The controlling signal line unit 140 includes the virtual ground line 133, a first bit line 103, a second bit line 104, a first word line 105 and a second word line 123. The virtual ground line 133 is disposed in a row direction and connected to the second bottom transistor unit 130. The first bit line 103 is disposed in a column direction and connected to the access transistor unit 150. The second bit line 104 is disposed in the column direction and connected to the access transistor unit 150. The first word line 105 is disposed in the row direction and connected to the access transistor unit 150. The second word line 123 is disposed in the column direction and connected to the first bottom transistor unit 120. Accordingly, the variable voltage levels of the controlling signal line unit 140 can effectively control the operational states of the static random access memory cell 100.

The access transistor unit 150 is connected between the latch 110 and the controlling signal line unit 140. The access transistor unit 150 is controlled by the controlling signal line unit 140 to perform connection and disconnection between the controlling signal line unit 140 and the first pseudo node 117, and the access transistor unit 150 is controlled by the controlling signal line unit 140 to perform connection and disconnection between the controlling signal line unit 140 and the second pseudo node 118. In detail, the access transistor unit 150 includes a first access transistor 101 and a second access transistor 102. The first access transistor 101 has a first access gate, a first access drain and a first access source. The first access gate is connected to the first word line 105. The first access drain is connected to the first bit line 103, and the first access source is connected to the first pseudo node 117. The first access transistor 101 is an NMOS transistor. Furthermore, the second access transistor 102 is corresponding to the first access transistor 101 and has a second access gate, a second access drain and a second access source. The second access gate is connected to the first word line 105. The second access drain is connected to the second bit line 104, and the second access source is connected to the second pseudo node 118. The second access transistor 102 is an NMOS transistor.

In FIG. 1, the static random access memory cell 100 includes ten transistors and five controlling signal lines. The top transistor unit 1102, the intermediate transistor unit 1104 and the first bottom transistor unit 120 of the latch 110 are composed of two P-type transistors, two N-type transistors, and two N-type transistors, respectively. The latch 110 has two pairs of controllable "feet" which are the first bottom transistor unit 120 and the second bottom transistor unit 130, respectively. The first bottom transistor unit 120 and the second bottom transistor unit 130 are employed to control the operational state of the static random access memory cell 100. Therefore, the controllable latch 110 and the pre-discharged bitlines of the present disclosure are capable of maintaining stability against read and half-selection disturbances simultaneously without sacrificing the write-ability so as to solve the problem that the conventional static random access memory cell is refined in pursuit of stability but sacrificing ability to write. Moreover, the structure of the present disclosure can save drastic area overhead consumed by a pumping capacitor of voltage-boost write-assisted circuit. In addition, the static random access memory cell 100 has six operational states which is a single-foot-hold state, a dual-feet-hold state, a read state, a write state, a column-half-selection state and a row-half-selection state, respectively, as shown in Table 1. The details of the six operational states are described below.

TABLE 1

| Operational state | 105 | 123 | 133 | 103/104 |
|---|---|---|---|---|
| Single-foot-hold state | 0 | 0 | 0 | floating |
| Read state | 1 | 0 | 0 | 0/0 (pre-discharge) |
| Write state | 1 | 0 | 1 | 1/0 or 0/1 |
| Column-half-selection state | 0 | 0 | 0 | 1/0 or 0/1 |
| Row-half-selection state | 1 | 1 | 1 | 0/0 (pre-discharge) |
| Dual-feet-hold state | 0 | 1 | 0 | 0/0 (pre-discharge) |

Figure 2A:
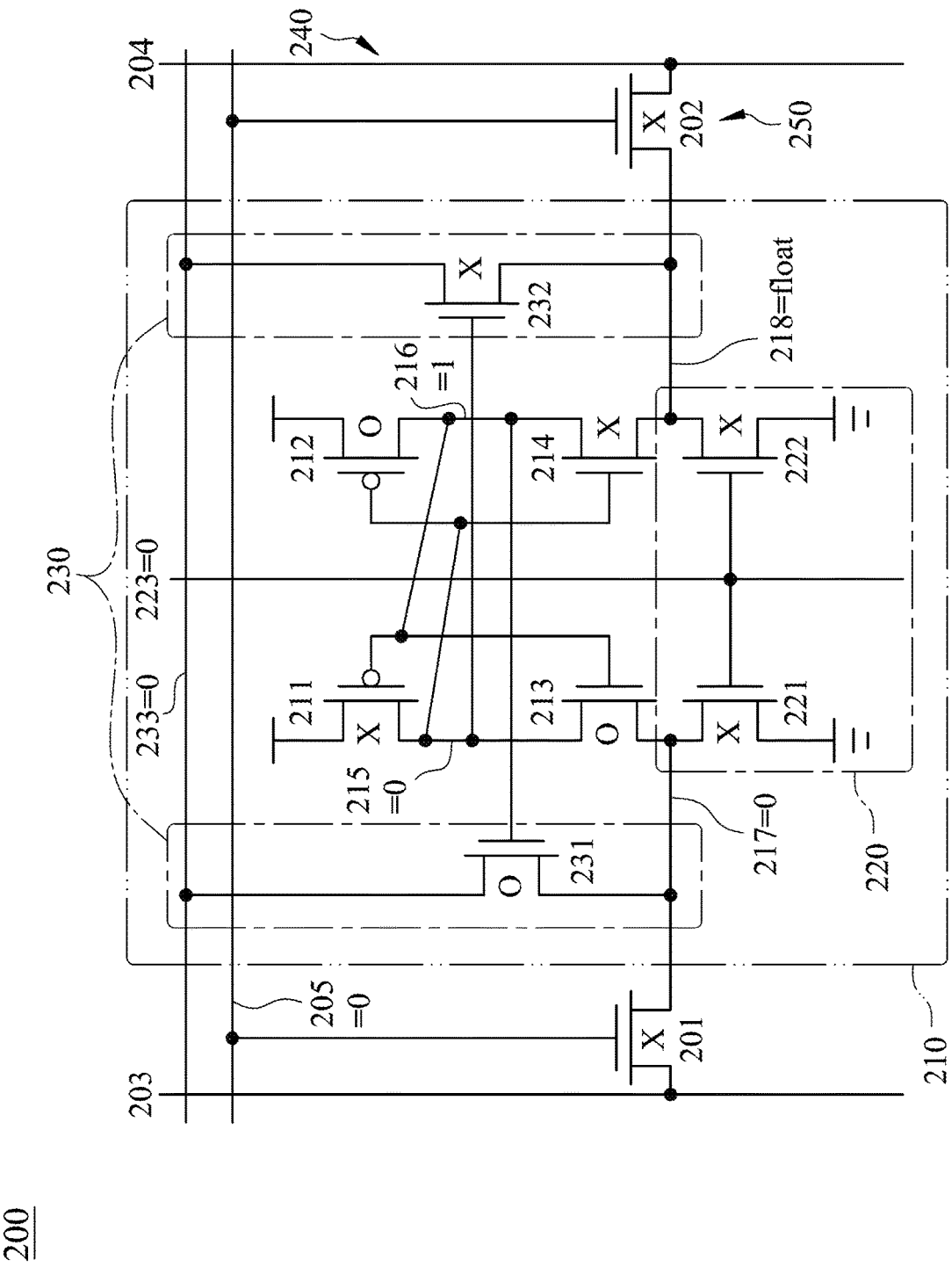
FIG. 2A shows the circuit diagram of the static random access memory cell in a single-foot-hold state of FIG. 1.

FIG. 2A shows the circuit diagram of the static random access memory cell 100 in the single-foot-hold state of FIG. 1. The structure of the static random access memory cell 200 of FIG. 2A is the same as that of the static random access memory cell 100 of FIG. 1. In FIG. 2A, the symbols "X" and "O" represent that the transistor is turned off and turned on, respectively. Since the static random access memory cell 200 has two feet, it has two operational states which are the single-foot-hold state and the dual-feet-hold state, respectively. When the static random access memory cell 200 is in the single-foot-hold state, the voltage level of 0 is applied to the first word line 205, the second word line 223 and the virtual ground line 233. In other words, the single-foot-hold state represents that the access transistor unit 250 and the first bottom transistor unit 220 are turned off to form a ground path. Because the voltage level of the first word line 205 is "0", the first access transistor 201 and the second access transistor 202 are both turned off, so that the latch 210 is disconnected from the first bit line 203 and the second bit line 204 without being affected by the voltage levels of the first bit line 203 and the second bit line 204. Since the voltage level of the second word line 223 is "0", the first bottom transistor unit 220 of the latch 210 is turned off. In addition, the voltage levels of the first internal node 215 and the second internal node 216 are "0" and "1", respectively. The first feet transistor 231 is turned on by the second internal node 216, and then the ground path is formed. The ground path is established by the first intermediate transistor 213, the first pseudo node 217, the first feet transistor 231 and the virtual ground line 233, so that the feedback loop of the latch 210 can be normally operated. The first bit line 203 and the second bit line 204 are floating. On the other hand, due to the voltage level of the first internal node 215 being "0", the second feet transistor 232 is turned off so as to disconnect the second pseudo node 218 from the virtual ground line 233. The second access transistor 202 and the second bottom transistor 222 are turned off by the first word line 205 and the second word line 223, respectively, and then the second pseudo node 218 is floating. Accordingly, the single-foot-hold state represents that one foot (the first pseudo node 217) is connected to the ground, and the other foot (the second pseudo node 218) is floating.

Figure 2B:
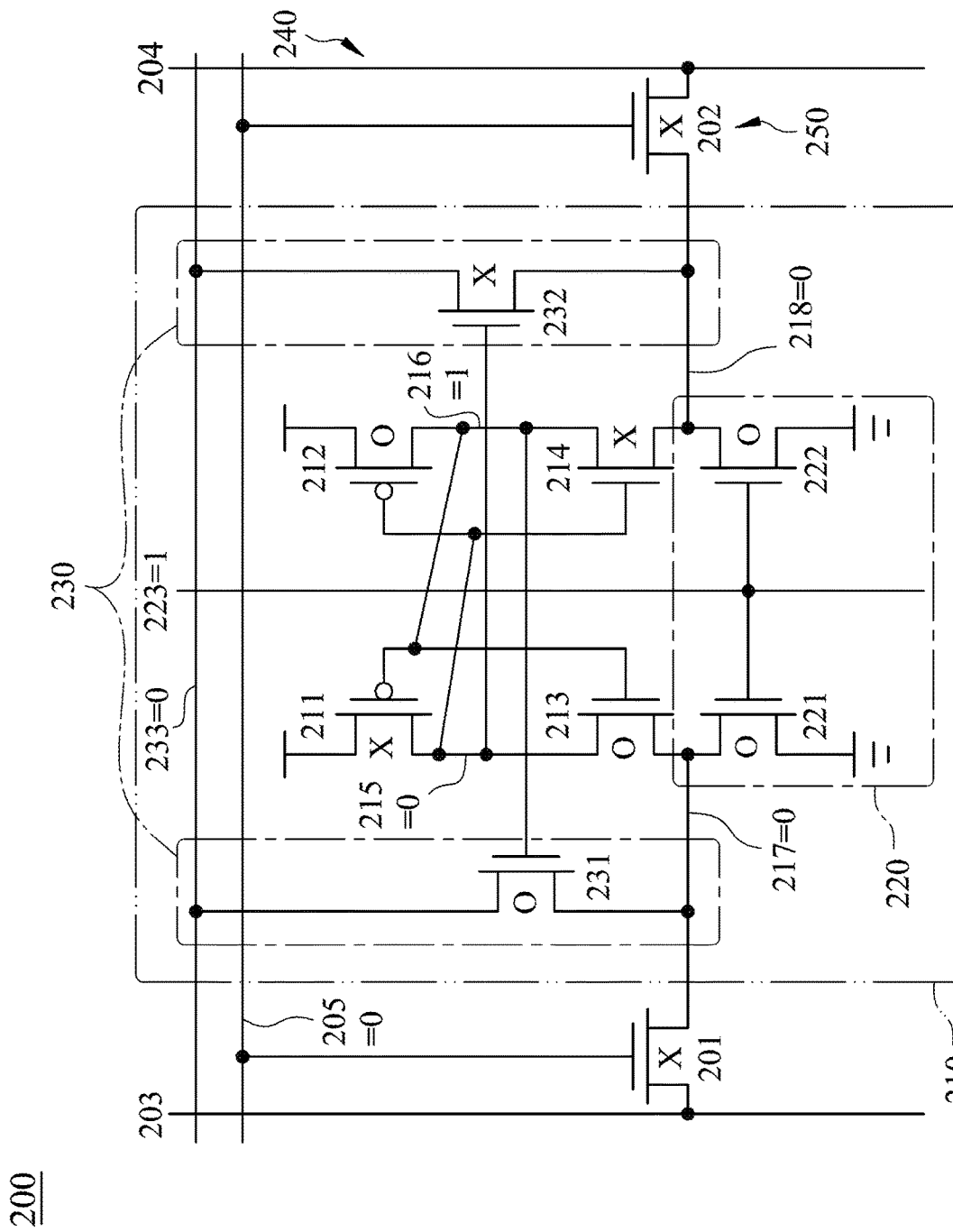
FIG. 2B shows the circuit diagram of the static random access memory cell in a dual-feet-hold state of FIG. 1.

FIG. 2B shows the circuit diagram of the static random access memory cell 100 in the dual-feet-hold state of FIG. 1. The structure of the static random access memory cell 200 of FIG. 2B is the same as that of the static random access memory cell 100 of FIG. 1. In FIG. 2B, the static random access memory cell 200 is in the dual-feet-hold state, and two feet are both connected to the ground. The voltage level of 0 is applied to the first word line 205 and the virtual ground line 233, and the voltage level of 1 is applied to the second word line 223. The voltage levels of the first internal node 215 and the second internal node 216 are "0" and "1", respectively. The dual-feet-hold state represents that the access transistor unit 250 is turned off, and the first bottom transistor unit 220 is turned on to form two ground paths. Because the voltage level of the first word line 205 is "0", the first access transistor 201 and the second access transistor 202 are both turned off, so that the latch 210 is disconnected from the first bit line 203 and the second bit line 204 without being affected by the voltage levels of the first bit line 203 and the second bit line 204. In addition, the voltage level of the second word line 223 is "1", so that the first pseudo node 217 and the second pseudo node 218 of the latch 210 are both connected to the ground via the first bottom transistor 221 and the second bottom transistor 222 to form the two ground paths. Therefore, the dual-feet-hold state does not compromise the feedback loop of the latch 210.

Figure 3A:
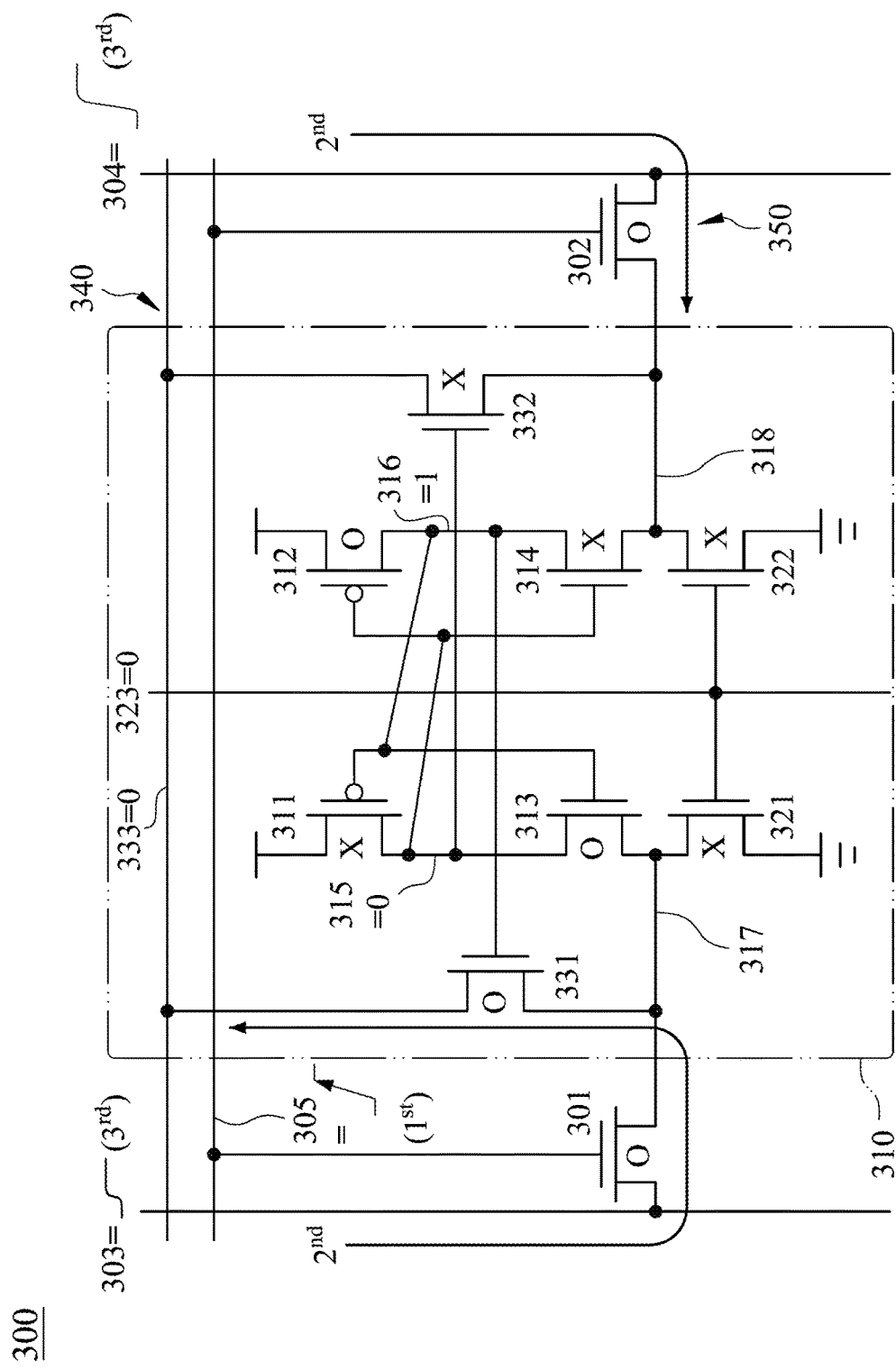
FIG. 3A shows the circuit diagram of the static random access memory cell in a read state of FIG. 1.
Figure 3B:
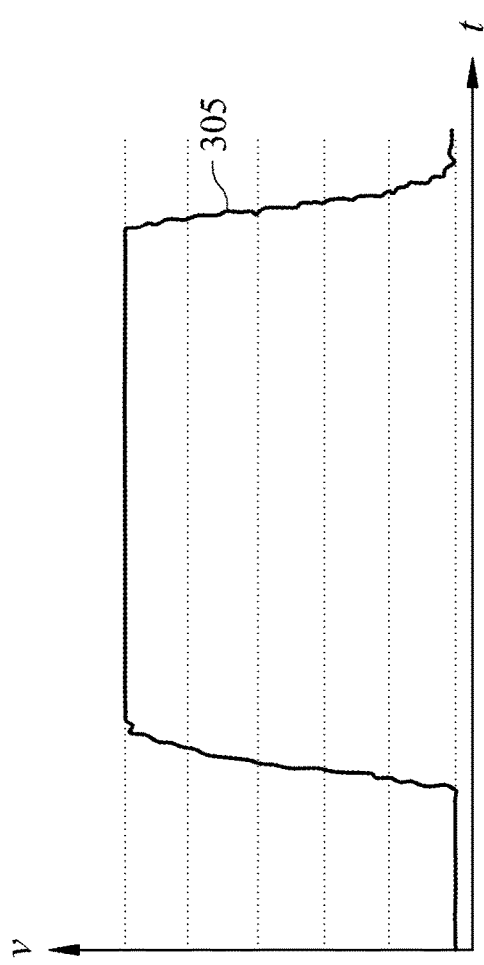
FIG. 3B shows a timing diagram of a voltage of a first word line of FIG. 3A.
Figure 3C:
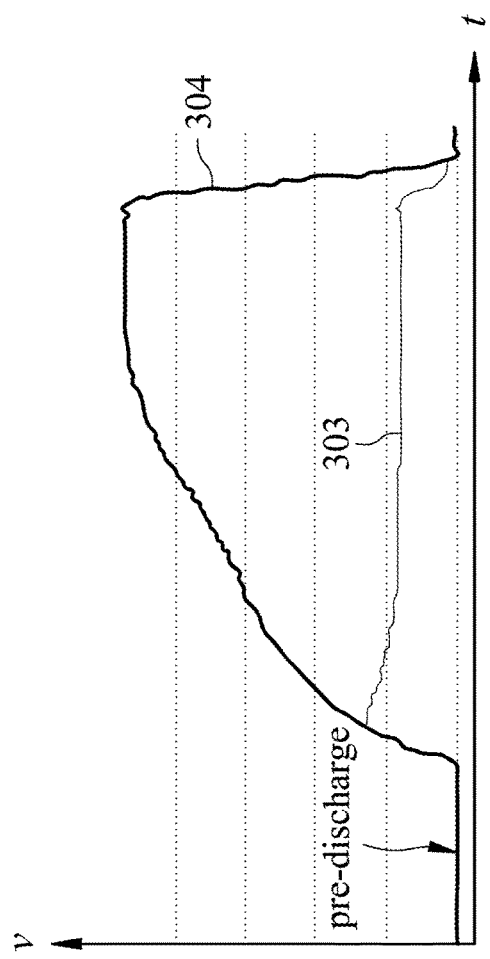
FIG. 3C shows timing diagrams of voltages of a first bit line and a second bit line of FIG. 3A.

FIG. 3A shows the circuit diagram of the static random access memory cell 100 in a read state of FIG. 1; FIG. 3B shows a timing diagram of a voltage of a first word line 305 of FIG. 3A; and FIG. 3C shows timing diagrams of voltages of a first bit line 303 and a second bit line 304 of FIG. 3A. The structure of the static random access memory cell 300 of FIG. 3A is the same as that of the static random access memory cell 100 of FIG. 1. In FIG. 3A, the read state represents that a plurality of signals stored in the latch 310 can be read out by the controlling signal line unit 340. In other words, the signals of the voltage levels of the first internal node 315 and the second internal node 316 can be read out by the first bit line 303 and the second bit line 304, respectively. The voltage level of 0 is applied to the second word line 323 and the virtual ground line 333. The voltage level of 1 is applied to the first word line 305. The read state can be divided into three stages which are corresponding to the symbols "$1^{st}$", "$2^{nd}$" and "$3^{rd}$" in FIG. 3A, respectively. Before the static random access memory cell 300 being in the read state, the second bit line 304 and the first bit line 303 are pre-discharged. The voltage level of the virtual ground line 333 is 0. In the first stage ($1^{st}$) of the read state, the voltage level of the first word line 305 is raised. When the voltage level of the first word line 305 is changed from 0 to 1, the first access transistor 301 and the second access transistor 302 of the access transistor unit 350 change from a turn-off condition to a turn-on condition. In the second stage ($2^{nd}$) of the read state, the voltage levels of the first internal node 315 and the second internal node 316 are "0" and "1", respectively, so that the first feet transistor 331 and the first access transistor 301 are turned on to form a discharge path. The discharge path is established by the first bit line 303, the first access transistor 301, the first pseudo node 317, the first feet transistor 331 and the virtual ground line 333. Then, a read circuit (not shown) connected to the first bit line 303 and the second bit line 304 starts to charge the first bit line 303 and the second bit line 304. A left side of the latch 310 has the discharge path and includes the first internal node 315, so that the first bit line 303 has a lower voltage level. On the contrary, there is no discharge path at a right side of the latch 310, thus gradually raising the voltage level of the second bit line 304 during the read state. The voltage level of the second word line 323 should be set to 0 for turning off the first bottom transistor 321 and the second bottom transistor 322. Finally, in the third stage ($3^{rd}$) of the read state, the second feet transistor 332 is turned off by the first internal node 315 for raising the voltage level of the second bit line 304 so as to generate a voltage difference between the second bit line 304 and the first bit line 303. A sense amplifier (not shown) connected between the second bit line 304 and the first bit line 303 can be used to amplify the voltage difference to accomplish the process of the read state.

Figure 4A:
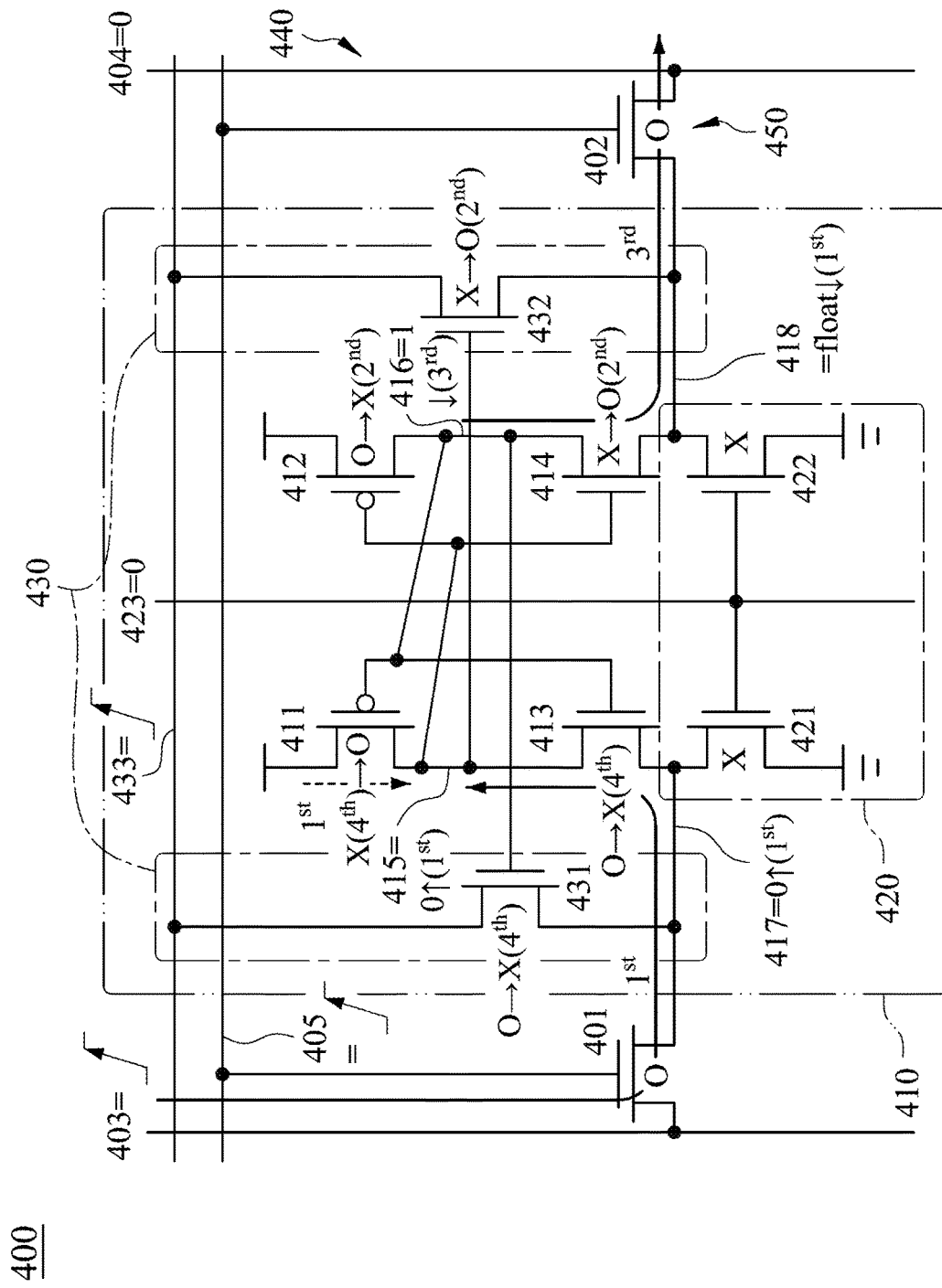
FIG. 4A shows the circuit diagram of the static random access memory cell in a write state of FIG. 1.
Figure 4B:
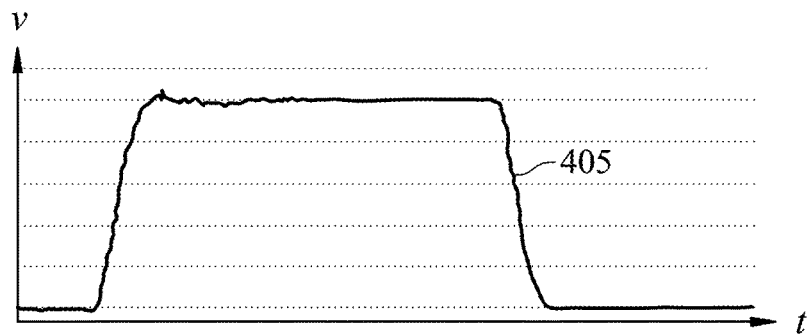
FIG. 4B shows a timing diagram of a voltage of a first word line of FIG. 4A.
Figure 4C:
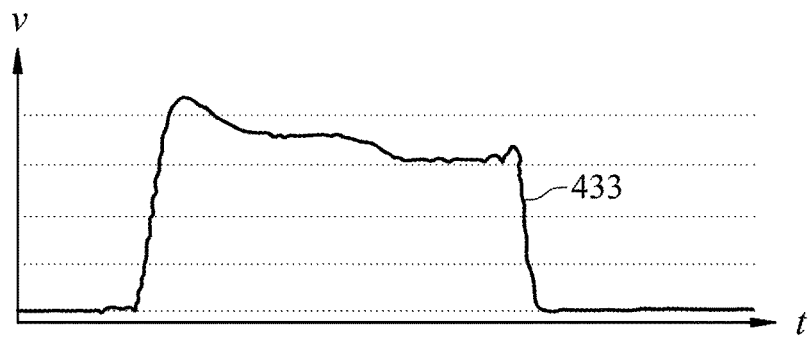
FIG. 4C shows a timing diagram of a voltage of a virtual ground line of FIG. 4A.
Figure 4D:
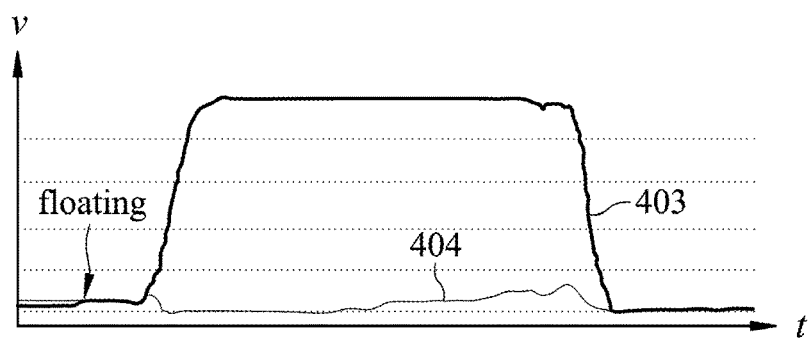
FIG. 4D shows timing diagrams of voltages of a first bit line and a second bit line of FIG. 4A.
Figure 4E:
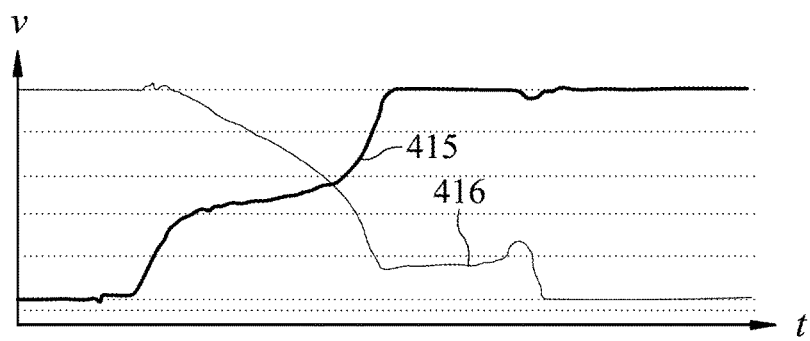
FIG. 4E shows timing diagrams of voltages of a first internal node and a second internal node of FIG. 4A.

FIG. 4A shows the circuit diagram of the static random access memory cell 100 in a write state of FIG. 1; FIG. 4B shows a timing diagram of a voltage of a first word line 405 of FIG. 4A; FIG. 4C shows a timing diagram of a voltage of a virtual ground line 433 of FIG. 4A; FIG. 4D shows timing diagrams of voltages of a first bit line 403 and a second bit line 404 of FIG. 4A; and FIG. 4E shows timing diagrams of voltages of a first internal node 415 and a second internal node 416 of FIG. 4A. The structure of the static random access memory cell 400 of FIG. 4A is the same as that of the static random access memory cell 100 of FIG. 1. In FIG. 4A, the write state represents that a plurality of signals stored in the latch 410 can be written by the controlling signal line unit 440. In other words, the signals of the voltage levels of the first internal node 415 and the second internal node 416 can be written by the first bit line 403 and the second bit line 404, respectively. The voltage level of 1 is applied to the first word line 405 and the virtual ground line 433, and the voltage level of 0 is applied to the second word line 423. The voltage levels of the first internal node 415 and the second internal node 416 are "0" and "1", respectively. Before the static random access memory cell 400 being in the write state, the voltage level of the first word line 405 is 0, and the first bit line 403 and the second bit line 404 are floating, as shown in FIGS. 4B and 4D. The static random access memory cell 400 belongs to one column of a static random access memory cell array to be written. At the beginning of the write state, the voltage level of the first word line 405 is raised from 0 to 1, and then the first access transistor 401 and the second access transistor 402 are turned on. A write circuit (not shown) connected to the first bit line 403 and the second bit line 404 determines the signals of the voltage levels of the first bit line 403 and the second bit line 404. At the same time, the voltage level of the virtual ground line 433 is also raised from 0 to 1, and the first feet drain of the first feet transistor 431 and the second feet drain of the second feet transistor 432 are no longer connected to the ground, so that the first internal node 415 cannot be connected to the ground via the first feet transistor 431. In addition, the voltage level of the second word line 423 is maintained at 0 so as to turn off the first bottom transistor 421 and the second bottom transistor 422. The first internal node 415 cannot be connected to the ground via the first bottom transistor 421. When all paths connecting the first internal node 415 to the ground are canceled, the first internal node 415 is floating, and the feedback loop of the latch 410 is unstable. Thus, the voltage values in the latch 410 are gradually changed by the first bit line 403 and the second bit line 404. In detail, the write state can be divided into four stages which are corresponding to the symbols "$1^{st}$", "$2^{nd}$", "$3^{rd}$" and "$4^{th}$" in FIG. 4A, respectively. In the first stage ($1^{st}$) of the write state, the first bit line 403 whose voltage level is 1 starts to charge the first internal node 415. A leakage current of the first top transistor 411 also starts to charge the first internal node 415, so that the voltage level of the first internal node 415 starts to rise. At the same time, the second bit line 404 located on the right side of the latch 410 is responsible for discharging the second internal node 416 so as to reduce the voltage level of the second internal node 416. In the second stage ($2^{nd}$) of the write state, the second intermediate transistor 414 located at a right center of the latch 410 is gradually turned on according to the rising voltage of the first internal node 415. In the meantime, the second top transistor 412 is gradually turned off, i.e., the charging current of the second internal node 416 is reduced gradually. In the third stage ($3^{rd}$) of the write state, the second intermediate transistor 414 which is gradually turned on produces a gradually increasing current, and the electric charges are taken away from the second internal node 416 to the second bit line 404 by the current. In the fourth stage ($4^{th}$) of the write state, the first top transistor 411 is gradually turned on because of a decreased voltage level of the second internal node 416, thereby accelerating the rising of the voltage level of the first internal node 415 and a transition process of the first stage ($1^{st}$) until the transition process is completed. Accordingly, the write state represents that the first bottom transistor unit 420 is turned off, and the second bottom transistor unit 430 is connected to the voltage level of 1 so as to increase the voltage level of the first internal node 415 and decrease the voltage level of the second internal node 416.

The static random access memory cell 400 of the present disclosure has a good writing ability without any auxiliary writing technology. This is because that the feedback loop of the latch 410 of the static random access memory cell 400 is compromised in the write state, so that the transition process of the latch 410 is smoothly accomplished without any resistance. In other words, the latch 410 includes two feet which can be closed in the write state. The two feet are the first bottom transistor unit 420 and the second bottom transistor unit 430, respectively. The first bottom transistor unit 420 is one pair of NMOS transistors which are the first bottom transistor 421 and the second bottom transistor 422, respectively, whose sources are both connected to the ground and whose gates are both controlled by the second word line 423. The second bottom transistor unit 430 is another pair of NMOS transistors which are the first feet transistor 431 and the second feet transistor 432, respectively. The gates of the first feet transistor 431 and the second feet transistor 432 are controlled by the first internal node 415 and the second internal node 416. The drains of the first feet transistor 431 and the second feet transistor 432 are controlled by the virtual ground line 433. Moreover, when the static random access memory cell 400 is in the write state, the first bottom transistor unit 420 is turned off the second word line 423, and one path connecting the latch 410 to the ground is canceled. At the same time, a virtual ground controller (not shown) charges the virtual ground line 433 to increase the voltage level of the virtual ground line 433, so that another path connecting the latch 410 to the ground is canceled, too. When all paths connecting the latch 410 to the ground are canceled, the first internal node 415 is floating and its voltage level of "0" cannot continue to maintain. Hence, the feedback loop of the latch 410 is unstable and compromised, so that the transition process of the latch 410 is smoothly accomplished without any resistance. In the first stage ($1^{st}$) of the write state, the first internal node 415 is charged. Due to all paths canceled, there is no other event that can resist the charge of the first internal node 415, and the transition process is smooth. Therefore, the static random access memory cell 400 of the present disclosure has a good writing ability without any auxiliary writing circuit.

Figure 5:
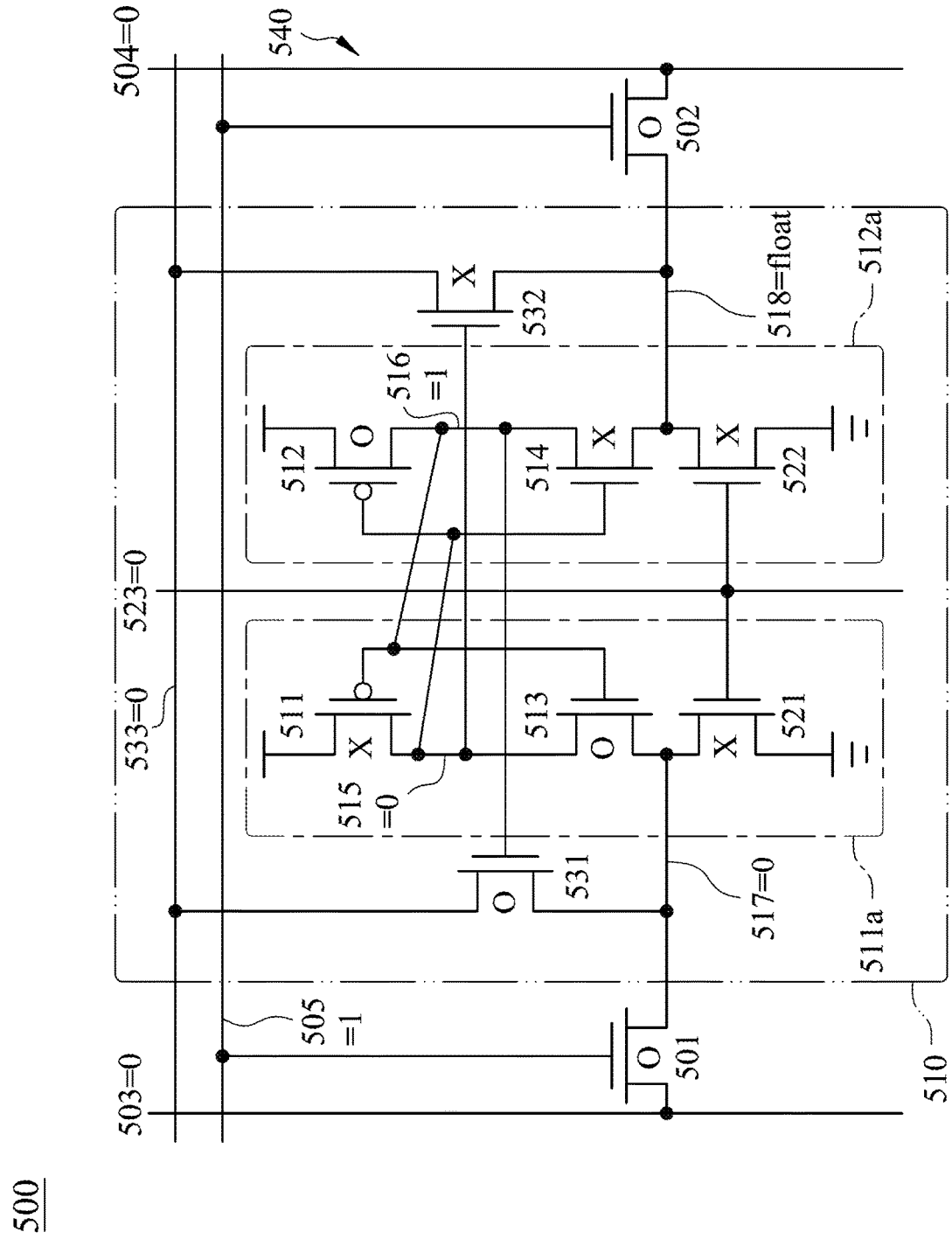
FIG. 5 shows the circuit diagram of the static random access memory cell against read disturbance of FIG. 3A.

FIG. 5 shows the circuit diagram of the static random access memory cell 300 against read disturbance of FIG. 3A. The structure of the static random access memory cell 500 of FIG. 5 is the same as that of the static random access memory cell 300 of FIG. 3A. The static random access memory cell 500 is capable of maintaining stability against read disturbance. In FIG. 3A, the voltage level of the first word line 305 is 0, and the first bit line 303 and the second bit line 304 are pre-discharged before the read state. In FIG. 5, the voltage level of the first word line 505 is changed from 0 to 1, and the static random access memory cell 500 is in the read state. The first internal node 515 is connected to the first bit lines 503 via the first intermediate transistor 513 and the first access transistor 501. The voltage levels of the first internal node 515 and the first bit lines 503 are both zero, and there is no voltage difference between the first internal node 515 and the first bit lines 503 to avoid read disturbance. In addition, the second bit line 504 is connected to the second pseudo node 518 by the second access transistor 502. The second intermediate transistor 514 controlled by the first internal node 515 is disposed between the second internal node 516 and the second pseudo node 518. The second intermediate transistor 514 is turned off because of the voltage level of the first internal node 515 being 0, so that the second bit line 504 does not interfere with the second internal node 516. Furthermore, when the voltage of the second bit line 504 is raised, the voltage of the second pseudo node 518 is increased, thereby increasing a voltage level required for transition of the inverter 512a of the latch 510 (i.e., a voltage threshold of the first internal node 515 which can change the voltage level of the second internal node 516). Thus, the second intermediate transistor 514 is less likely to be turned on in the read state so as to protect the voltage level of the second internal node 516 against disturbances. The inverter 512a includes the second top transistor 512, the second intermediate transistor 514 and the second bottom transistor 522. The inverter 511a includes the first top transistor 511, the first intermediate transistor 513 and the first bottom transistor 521.

Figure 6:
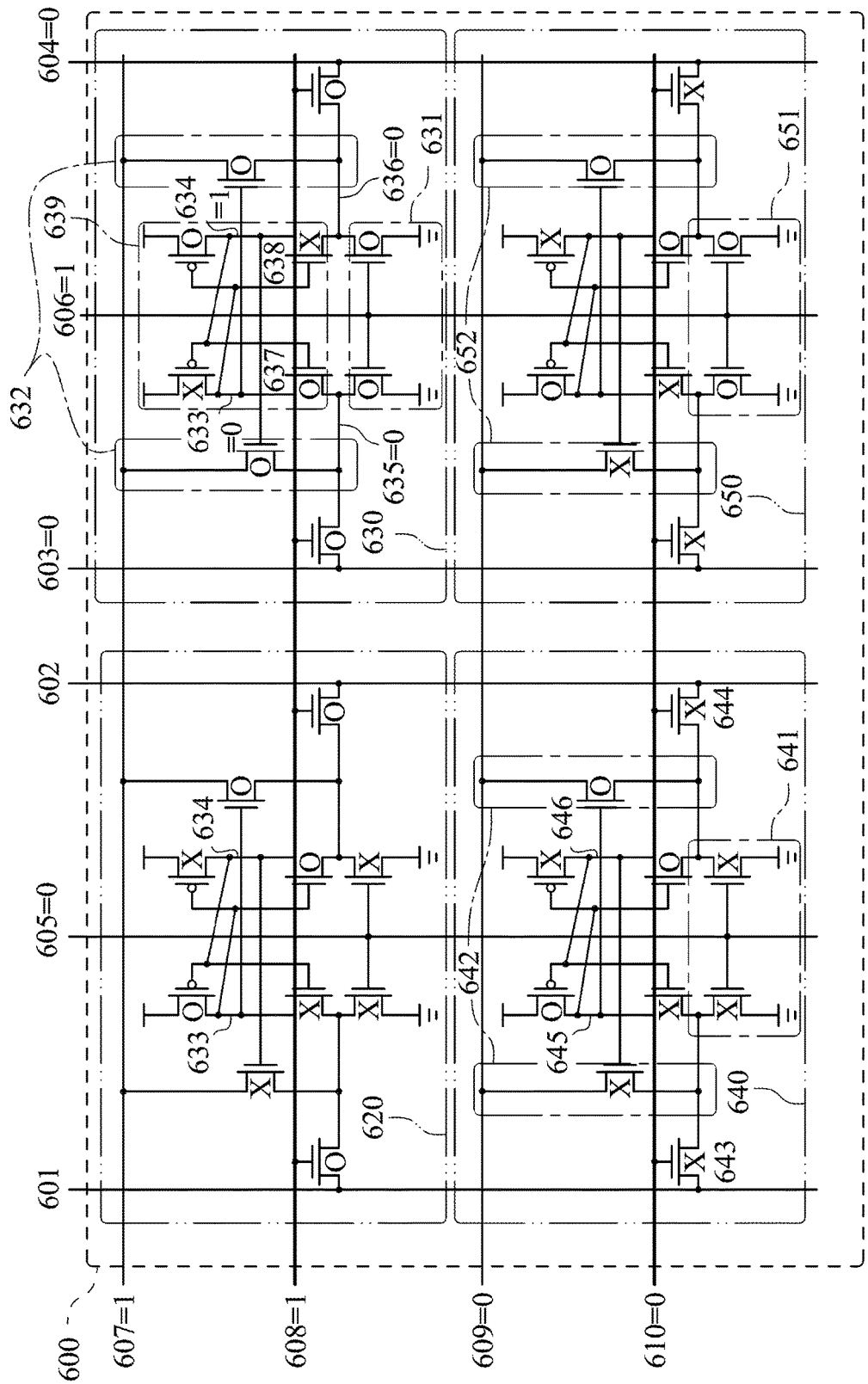
FIG. 6 shows a circuit diagram of a static random access memory cell array according to one embodiment of the present disclosure.

FIG. 6 shows a circuit diagram of a static random access memory cell array 600 according to one embodiment of the present disclosure. The static random access memory cell array 600 is a 2×2 bit-interleaving memory array. The static random access memory cell array 600 includes four static random access memory cells 620, 630, 640, 650, six column controlling signal lines 601, 602, 603, 604, 605, 606 and four row controlling signal lines 607, 608, 609, 610. The four static random access memory cells 620, 630, 640, 650 are located on an upper left corner region, an upper right corner region, a lower left corner region and a lower right corner region, respectively. The structure of each of the four static random access memory cells 620, 630, 640, 650 of FIG. 6 is the same as that of the static random access memory cell 100 of FIG. 1. The two static random access memory cells 620, 630 are connected to each other via the two row controlling signal lines 607, 608 in a row direction. The two static random access memory cells 640, 650 are connected to each other via the two row controlling signal lines 609, 610 in the row direction. The two static random access memory cells 620, 640 are connected to each other via the three column controlling signal lines 601, 602, 605 in a column direction. The two static random access memory cells 630, 650 are connected to each other via the three column controlling signal lines 603, 604, 606 in the column direction. The two row controlling signal lines 607, 609 are corresponding to the virtual ground line 133 of FIG. 1. The two row controlling signal lines 608, 610 are corresponding to the first word line 105 of FIG. 1. The two column controlling signal lines 601, 603 are corresponding to the first bit line 103 of FIG. 1. The two column controlling signal lines 602, 604 are corresponding to the second bit line 104 of FIG. 1. The two column controlling signal lines 605, 606 are corresponding to the second word line 123 of FIG. 1. It is obvious that the two adjacent static random access memory cells are connected to each other. Moreover, the static random access memory cell 620 located on the upper left corner region is in the write state. The static random access memory cell 630 located on the upper right corner region and the static random access memory cell 620 belong to the same row, and the static random access memory cell 630 is in the row-half-selection state. The static random access memory cell 640 located on the lower left corner region and the static random access memory cell 620 belong to the same column, and the static random access memory cell 640 is in the column-half-selection state. The static random access memory cell 650 located on the lower right corner region is in the dual-feet-hold state. The static random access memory cells 620, 630, 640, 650 of the present disclosure used in the bit-interleaving memory array can maintain stability against row-half-selection disturbance and column-half-selection disturbance without sacrificing the write-ability. The reason for avoiding row-half-selection disturbance and column-half-selection disturbance will be respectively discussed in the following two paragraphs.

In FIG. 6, the static random access memory cell 630 located on the upper right corner region is in the row-half-selection state. Referring to table 1, the voltage levels of the two row controlling signal lines 607, 608 and the column controlling signal line 606 are "1", and the voltage levels of the two column controlling signal lines 603, 604 are "0". The two row controlling signal lines 607, 608 are shared by the two static random access memory cells 620, 630 in the same row, and the voltage levels of the two row controlling signal lines 607, 608 are both 1. When the voltage level of the row controlling signal line 607 (corresponding to the virtual ground line 133 in FIG. 1) is 1, the latch of the static random access memory cell 630 (corresponding to the latch 110 in FIG. 1) loses one foot, i.e., the second bottom transistor unit 632 (corresponding to the second bottom transistor unit 130 in FIG. 1) cannot be connected to the ground. However, the static random access memory cell 630 can be controlled by the column controlling signal line 606. The column controlling signal lines 605, 606 are disposed in the column direction and may be independently controlled. In the row-half-selection state, the voltage level of the column controlling signal line 606 is set to "1", so that the latch can hold the other foot connected to the ground, i.e., the first bottom transistor unit 631 (corresponding to the first bottom transistor unit 120 in FIG. 1) may be connected to the ground. The first pseudo node 635 and the second pseudo node 636 are both connected to the ground, thereby equivalently converting an original three-layer structure (i.e., the latch 639 and the first bottom transistor unit 631) into a two-layer structure (i.e., the latch 639). Accordingly, the feedback loop of the latch may maintain stability against disturbances, and this is a first anti-disturbing step in the row-half-selection state. In addition, before the static random access memory cell 630 being in the row-half-selection state, the voltage level of the row controlling signal line 608 is 0. The two column controlling signal lines 603, 604 are pre-discharged, i.e., the voltage levels of the two column controlling signal lines 603, 604 are 0. When the voltage level of the row controlling signal line 608 is changed from 0 to 1, the first internal node 633 of the static random access memory cell 630 is connected to the column controlling signal line 603, and maintains the original voltage level of "0" without disturbance because there is no voltage difference between the first internal node 633 and the column controlling signal line 603. On the other hand, the voltage level of the second internal node 634 is 1. The second intermediate transistor 638 controlled by the first internal node 633 is disposed between the second internal node 634 and the column controlling signal line 604. The second intermediate transistor 638 is turned off because of the voltage level of the first internal node 633 being 0, so that the column controlling signal line 604 does not interfere with the second internal node 634, and this is a second anti-disturbing step in the row-half-selection state. Therefore, the static random access memory cell 630 of the present disclosure utilizes the first anti-disturbing step and the second anti-disturbing step to avoid the row-half-selection disturbance.

In FIG. 6, the static random access memory cell 640 located on the lower left corner region is in the column-half-selection state. Referring to table 1, the voltage levels of the two row controlling signal lines 609, 610 and the column controlling signal line 605 are "0". The column controlling signal line 605 is shared by the two static random access memory cells 620, 640 in the same column, and the voltage level of the column controlling signal line 605 is 0. When the voltage level of the column controlling signal line 605

(corresponding to the second word line 123 in FIG. 1) is 0, the first bottom transistor unit 641 of the latch of the static random access memory cell 640 (corresponding to the first bottom transistor unit 120 in FIG. 1) is turned off. The voltage levels of signal line configuration of the column-half-selection state are similar to that of the single-foot-hold state, i.e., the voltage levels of the two row controlling signal lines 609, 610 and the column controlling signal line 605 are all 0 in the column-half-selection state and the single-foot-hold state. The difference between the column-half-selection state and the single-foot-hold state is that the column controlling signal lines 601, 602 in the single-foot-hold state are floating, and the column controlling signal lines 601, 602 in the column-half-selection state are the data to be written. The voltage levels of the two column controlling signal lines 601, 602 are opposite to each other. The first access transistor 643 and the second access transistor 644 are turned off by the row controlling signal line 610 whose voltage level is 0, so that the row controlling signal line 610 do not interfere with the first internal node 645 and the second internal node 646. Hence, the static random access memory cell array 600 of the present disclosure are capable of maintaining stability against read disturbance, row-half-selection disturbance and column-half-selection disturbance simultaneously without sacrificing the write-ability. It is very suitable for applying the static random access memory cells 620, 630, 640, 650 to the bit-interleaving memory array.

Figure 7:
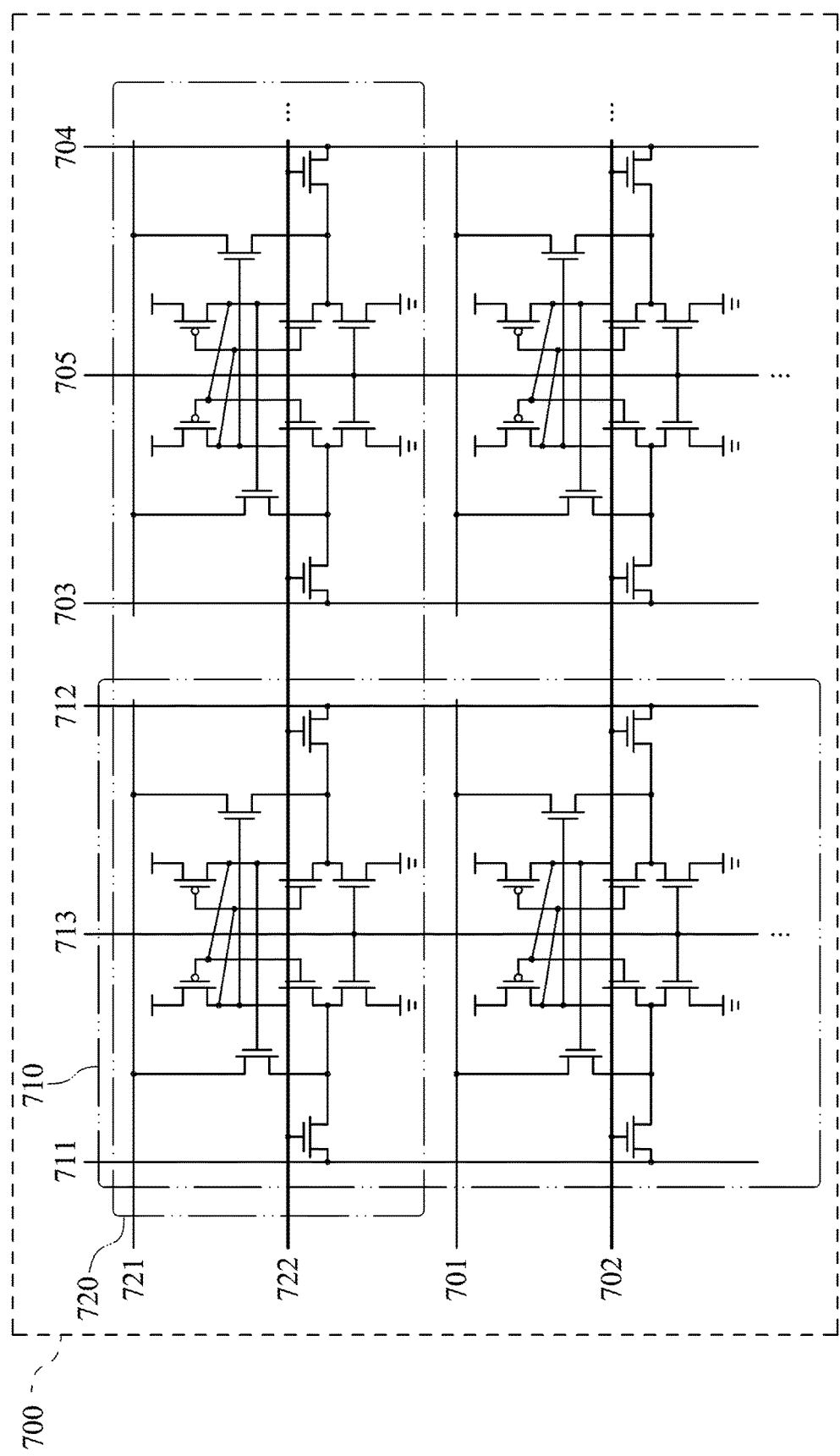
FIG. 7 shows a circuit diagram of a static random access memory cell array according to another embodiment of the present disclosure.

FIG. 7 shows a circuit diagram of a static random access memory cell array 700 according to another embodiment of the present disclosure. Referring to FIG. 1, the static random access memory cell array 700 is an n×m bit-interleaving memory array which includes n×m static random access memory cells 100. The parameters n, m are both greater than 2. Different column groups 710 can be controlled by different column controlling signal lines 703, 704, 705, 711, 712, 713. Different row groups 720 can be controlled by different row controlling signal lines 701, 702, 721, 722. Accordingly, the static random access memory cell array 700 of the present disclosure can effectively control the operational state of each of n×m static random access memory cells 100 by specifically setting the controlling signal lines to maintain stability and ability to write.

Figure 8:
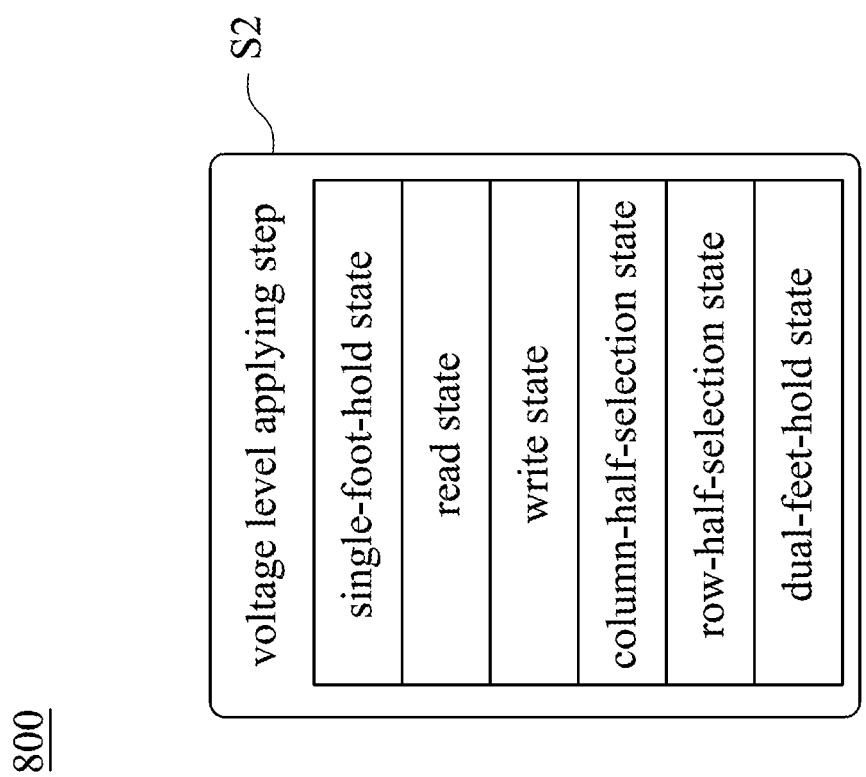
FIG. 8 shows a flow chart of an operating method of a static random access memory cell according to one embodiment of the present disclosure.

FIG. 8 shows a flow chart of an operating method 800 of a static random access memory cell 100 according to one embodiment of the present disclosure. Referring to FIG. 1 and Table 1, the operating method 800 is used to control the operational states of the static random access memory cell 100 and includes a voltage level applying step S2. The voltage level applying step S2 is for applying a plurality of voltage levels to a virtual ground line 133, a first bit line 103, a second bit line 104, a first word line 105 and a second word line 123, respectively. The controlling signal line unit 140 includes the virtual ground line 133, the first bit line 103, the second bit line 104, the first word line 105 and the second word line 123. The static random access memory cell 100 is controlled by the controlling signal line unit 140 to enter an operational state. The operational states include a single-foot-hold state, a dual-feet-hold state, a read state, a write state, a column-half-selection state and a row-half-selection state, as shown in Table 1. Therefore, the controllable latch 110 and the pre-discharged bitlines of the present disclosure are capable of maintaining stability against read and half-selection disturbances simultaneously without sacrificing the write-ability so as to solve the problem that the conventional static random access memory cell is refined in pursuit of stability but sacrificing ability to write. Moreover, the structure of the present disclosure can save drastic area overhead consumed by a pumping capacitor of voltage-boost write-assisted circuit.

According to the aforementioned embodiments and examples, the advantages of the present disclosure are described as follows.

1. The static random access memory cell array, the static random access memory cell and the operating method thereof of the present disclosure use the virtual ground line and the second word line to effectively control the second bottom transistor unit and the first bottom transistor unit, respectively. Furthermore, the first word line is utilized to control the access transistor unit with the first bit line and the second bit line so as to maintain stability and ability to write.

2. The static random access memory cell of the present disclosure is capable of maintaining stability against read disturbance, row-half-selection disturbance and column-half-selection disturbance simultaneously without sacrificing the write-ability. It is very suitable for applying the static random access memory cell to the bit-interleaving memory array.

3. The static random access memory cell array of the present disclosure can effectively control the operational state of each of the static random access memory cells by specifically setting the controlling signal line unit.

4. The controllable latch and the pre-discharged bitlines of the present disclosure are capable of maintaining stability against read and half-selection disturbances simultaneously without sacrificing the write-ability so as to solve the problem that the conventional static random access memory cell is refined in pursuit of stability but sacrificing ability to write.

5. The structure of the present disclosure can save drastic area overhead consumed by a pumping capacitor of voltage-boost write-assisted circuit.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A static random access memory cell, comprising:
   a controlling signal line unit;
   a latch electrically connected to the controlling signal line unit, wherein the latch has a first internal node, a second internal node, a first pseudo node and a second pseudo node, and the latch comprises:
      a top transistor unit connected to the first internal node and the second internal node;
      an intermediate transistor unit connected to the first internal node, the second internal node, the first pseudo node and the second pseudo node;
      a first bottom transistor unit connected to the first pseudo node, the second pseudo node and the controlling signal line unit, wherein the first bottom transistor unit is controlled by the controlling signal line unit to change voltage levels of the first pseudo node and the second pseudo node; and
      a second bottom transistor unit connected to the first internal node, the second internal node, the first pseudo node, the second pseudo node and the controlling signal line unit, wherein the second bottom transistor unit is controlled by the first internal node to perform connection and disconnection between the controlling signal line unit and the second pseudo node, and the second bottom transistor unit is controlled by the second internal node to perform connection and disconnection between the controlling signal line unit and the first pseudo node; and an access transistor unit connected between the latch and the controlling signal line unit, wherein the access transistor unit is controlled by the controlling signal line unit to perform connection and disconnection between the controlling signal line unit and the first pseudo node, and the access transistor unit is controlled by the controlling signal line unit to perform connection and disconnection between the controlling signal line unit and the second pseudo node;

wherein the top transistor unit, the intermediate transistor unit, the first bottom transistor unit, the second bottom transistor unit and the access transistor unit comprise a plurality of transistors, and each of the transistors has a source, a drain and a gate.

2. The static random access memory cell of claim 1, wherein the controlling signal line unit comprises:
a virtual ground line disposed in a row direction and connected to the second bottom transistor unit;
a first bit line disposed in a column direction and connected to the access transistor unit;
a second bit line disposed in the column direction and connected to the access transistor unit;
a first word line disposed in the row direction and connected to the access transistor unit; and
a second word line disposed in the column direction and connected to the first bottom transistor unit.

3. The static random access memory cell of claim 2, wherein,
when a voltage level of 0 is applied to the first word line, the second word line and the virtual ground line, the static random access memory cell is in a single-foot-hold state, the first bit line and the second bit line are floating, and the single-foot-hold state represents that the access transistor unit and the first bottom transistor unit are turned off to form a ground path; and
when the voltage level of 0 is applied to the first word line and the virtual ground line, and a voltage level of 1 is applied to the second word line, the static random access memory cell is in a dual-feet-hold state, and the dual-feet-hold state represents that the access transistor unit is turned off, and the first bottom transistor unit is turned on to form two ground paths.

4. The static random access memory cell of claim 1, wherein the top transistor unit comprises:
a first top transistor having a first top gate, a first top drain and a first top source, wherein the first top gate is connected to the second internal node, the first top drain is connected to the first internal node, and the first top source is connected to a voltage source; and
a second top transistor corresponding to the first top transistor and having a second top gate, a second top drain and a second top source, wherein the second top gate is connected to the first internal node, the second top drain is connected to the second internal node, and the second top source is connected to the voltage source.

5. The static random access memory cell of claim 1, wherein the intermediate transistor unit comprises:

a first intermediate transistor having a first intermediate gate, a first intermediate drain and a first intermediate source, wherein the first intermediate gate is connected to the second internal node, the first intermediate drain is connected to the first internal node, and the first intermediate source is connected to the first pseudo node; and
a second intermediate transistor corresponding to the first intermediate transistor and having a second intermediate gate, a second intermediate drain and a second intermediate source, wherein the second intermediate gate is connected to the first internal node, the second intermediate drain is connected to the second internal node, and the second intermediate source is connected to the second pseudo node.

6. The static random access memory cell of claim 1, wherein the first bottom transistor unit comprises:
a first bottom transistor having a first bottom gate, a first bottom drain and a first bottom source, wherein the first bottom gate is connected to the controlling signal line unit, the first bottom drain is connected to the first pseudo node, and the first bottom source is connected to a ground voltage; and
a second bottom transistor corresponding to the first bottom transistor and having a second bottom gate, a second bottom drain and a second bottom source, wherein the second bottom gate is connected to the controlling signal line unit, the second bottom drain is connected to the second pseudo node, and the second bottom source is connected to the ground voltage.

7. The static random access memory cell of claim 2, wherein the second bottom transistor unit comprises:
a first feet transistor having a first feet gate, a first feet drain and a first feet source, wherein the first feet gate is connected to the second internal node, the first feet drain is connected to the first pseudo node, and the first feet source is connected to the virtual ground line; and
a second feet transistor corresponding to the first feet transistor and having a second feet gate, a second feet drain and a second feet source, wherein the second feet gate is connected to the first internal node, the second feet drain is connected to the second pseudo node, and the second feet source is connected to the virtual ground line.

8. The static random access memory cell of claim 7, wherein,
when a voltage level of 1 is applied to the first word line, and a voltage level of 0 is applied to the second word line and the virtual ground line, the static random access memory cell is in a read state, the read state represents that the access transistor unit and the first feet transistor are turned on to form a discharge path, the second feet transistor is turned off for raising the voltage level of the second bit line so as to generate a voltage difference between the second bit line and the first bit line, and before the static random access memory cell being in the read state, the second bit line and the first bit line are pre-discharged.

9. The static random access memory cell of claim 2, wherein the access transistor unit comprises:
a first access transistor having a first access gate, a first access drain and a first access source, wherein the first access gate is connected to the first word line, the first access drain is connected to the first bit line, and the first access source is connected to the first pseudo node; and a second access transistor corresponding to the first access transistor and having a second access gate, a second access drain and a second access source, wherein the second access gate is connected to the first word line, the second access drain is connected to the second bit line, and the second access source is connected to the second pseudo node.

10. The static random access memory cell of claim 2, wherein,
when a voltage level of 1 is applied to the first word line and the virtual ground line, and a voltage level of 0 is applied to the second word line, the static random access memory cell is in a write state, the write state represents that the first bottom transistor unit is turned off, and the second bottom transistor unit is connected to the voltage level of 1 so as to increase the voltage level of the first internal node and decrease the voltage level of the second internal node, and before the static random access memory cell being in the write state, the first bit line and the second bit line are floating;
when the voltage level of 1 is applied to the first word line, the second word line and the virtual ground line, the static random access memory cell is in a row-half-selection state, and before the static random access memory cell being in the row-half-selection state, the second bit line and the first bit line are pre-discharged; and
when the voltage level of 0 is applied to the first word line, the second word line and the virtual ground line, and the voltage levels of the first bit line and the second bit line are opposite to each other, the static random access memory cell is in a column-haft-selection state.

11. A static random access memory cell array, comprising:
at least four static random access memory cells located on an upper left corner region, an upper right corner region, a lower left corner region and a lower right corner region, respectively, wherein the two adjacent static random access memory cells are connected to each other, and each of the four static random access memory cells comprises:
a controlling signal line unit;
a latch electrically connected to the controlling signal line unit, wherein the latch has a first internal node, a second internal node, a first pseudo node and a second pseudo node, and the latch comprises:
a top transistor unit connected to the first internal node and the second internal node;
an intermediate transistor unit connected to the first internal node, the second internal node, the first pseudo node and the second pseudo node;
a first bottom transistor unit connected to the first pseudo node, the second pseudo node and the controlling signal line unit, wherein the first bottom transistor unit is controlled by the controlling signal line unit to change voltage levels of the first pseudo node and the second pseudo node; and
a second bottom transistor unit connected to the first internal node, the second internal node, the first pseudo node, the second pseudo node and the controlling signal line unit, wherein the second bottom transistor unit is controlled by the first internal node and the second internal node to perform connection and disconnection between the controlling signal line unit and the second pseudo node, and the second bottom transistor unit is controlled by the second internal node to perform connection and disconnection between the controlling signal line unit and the first pseudo node; and
an access transistor unit connected between the latch and the controlling signal line unit, wherein the access transistor unit is controlled by the controlling signal line unit to perform connection and disconnection between the controlling signal line unit and the first pseudo node, and the access transistor unit is controlled by the controlling signal line unit to perform connection and disconnection between the controlling signal line unit and the second pseudo node;
wherein the top transistor unit, the intermediate transistor unit, the first bottom transistor unit, the second bottom transistor unit and the access transistor unit comprise a plurality of transistors, and each of the transistors has a source, a drain and a gate.

12. The static random access memory cell array of claim 11, further comprising:
two column controlling signal lines connected to the static random access memory cells, wherein one of the two column controlling signal lines is connected to the two controlling signal line units of the two static random access memory cells located on the upper left corner region and the lower left corner region, respectively, and the other of the two column controlling signal lines is connected to the two controlling signal line units of the two static random access memory cells located on the upper right corner region and the right left corner region, respectively; and
four row controlling signal lines connected to the static random access memory cells, wherein two of the four row controlling signal lines are connected to the two second bottom transistor units and the two access transistor units of the two static random access memory cells located on the upper left corner region and the upper right corner region, respectively, and the other two of the four row controlling signal lines are connected to the two second bottom transistor units and the two access transistor units of the two static random access memory cells located on the lower left corner region and the lower right corner region, respectively.

13. The static random access memory cell array of claim 11, wherein the controlling signal line unit of each of the four static random access memory cells comprises:
a virtual ground line disposed in a row direction and connected to the second bottom transistor unit;
a first bit line disposed in a column direction and connected to the access transistor unit;
a second bit line disposed in the column direction and connected to the access transistor unit;
a first word line disposed in the row direction and connected to the access transistor unit; and
a second word line disposed in the column direction and connected to the first bottom transistor unit.

14. The static random access memory cell array of claim 13, wherein,
when a voltage level of 0 is applied to the first word line, the second word line and the virtual ground line of one of the four static random access memory cells, the static random access memory cell is in a single-foot-hold state, the first bit line and the second bit line are floating, and the single-foot-hold state represents that the access transistor unit and the first bottom transistor unit of the static random access memory cell are turned off to form a ground path.

15. The static random access memory cell array of claim 13, wherein the second bottom transistor unit of each of the four static random access memory cells comprises:
- a first feet transistor having a first feet gate, a first feet drain and a first feet source, wherein the first feet gate is connected to the second internal node, the first feet drain is connected to the first pseudo node, and the first feet source is connected to the virtual ground line; and
- a second feet transistor corresponding to the first feet transistor and having a second feet gate, a second feet drain and a second feet source, wherein the second feet gate is connected to the first internal node, the second feet drain is connected to the second pseudo node, and the second feet source is connected to the virtual ground line.

16. The static random access memory cell array of claim 15, wherein,
- when a voltage level of 1 is applied to the first word line of one of the four static random access memory cells, and a voltage level of 0 is applied to the second word line and the virtual ground line of the static random access memory cell, the static random access memory cell is in a read state, the read state represents that the access transistor unit and the first feet transistor are turned on to form a discharge path, the second feet transistor is turned off for raising the voltage level of the second bit line so as to generate a voltage difference between the second bit line and the first bit line, and before the static random access memory cell being in the read state, the second bit line and the first bit line are pre-discharged.

17. The static random access memory cell array of claim 13, wherein,
- when a voltage level of 1 is applied to the first word line and the virtual ground line of one of the four static random access memory cells, and a voltage level of 0 is applied to the second word line of the static random access memory cell, the static random access memory cell is in a write state, the write state represents that the first bottom transistor unit is turned off, and the second bottom transistor unit is connected to the voltage level of 1 so as to increase the voltage level of the first internal node and decrease the voltage level of the second internal node, and before the static random access memory cell being in the write state, the first bit line and the second bit line are floating.

18. The static random access memory cell array of claim 17, wherein,
- the static random access memory cell located on the upper left corner region is in the write state, when the voltage level of 1 is applied to the first word line, the second word line and the virtual ground line of the static random access memory cell located on the upper right corner region, the static random access memory cell located on the upper right corner region is in a row-half-selection state, and before the static random access memory cell being in the row-half-selection state, the second bit line and the first bit line are pre-discharged;
- when the voltage level of 0 is applied to the first word line and the virtual ground line of the static random access memory cell located on the lower right corner region, and the voltage level of 1 is applied to the second word line of the static random access memory cell, the static random access memory cell is in a dual-feet-hold state, and the dual-feet-hold state represents that the access transistor unit is turned off and the first bottom transistor unit is turned on to form two ground paths; and
- when the voltage level of 0 is applied to the first word line, the second word line and the virtual ground line of the static random access memory cell located on the lower left corner region, and the voltage levels of the first bit line and the second bit line of the static random access memory cell are opposite to each other, the static random access memory cell is in a column-half-selection state.

19. An operating method of the static random access memory cell of claim 1, comprising:
- providing a voltage level applying step, wherein the voltage level applying step is for applying a plurality of voltage levels to a virtual ground line, a first bit line, a second bit line, a first word line and a second word line, respectively, and the controlling signal line unit comprises the virtual ground line, the first bit line, the second bit line, the first word line and the second word line;
- wherein the static random access memory cell is controlled by the controlling signal line unit to enter an operational state.

20. The operating method of claim 19, wherein,
- when the operational state of the static random access memory cell is in a single-foot-hold state, a voltage level of 0 is applied to the first word line, the second word line and the virtual ground line, the first bit line and the second bit line are floating;
- when the operational state of the static random access memory cell is in a dual-feet-hold state, the voltage level of 0 is applied to the first word line and the virtual ground line, and a voltage level of 1 is applied to the second word line;
- when the operational state of the static random access memory cell is in a read state, the voltage level of 1 is applied to the first word line, and the voltage level of 0 is applied to the second word line and the virtual ground line, and before the operational state being in the read state, the second bit line and the first bit line are pre-discharged;
- when the operational state of the static random access memory cell is in a write state, the voltage level of 1 is applied to the first word line and the virtual ground line, and the voltage level of 0 is applied to the second word line, and before the operational state being in the write state, the first bit line and the second bit line are floating;
- when the operational state of the static random access memory cell is in a row-half-selection state, the voltage level of 1 is applied to the first word line, the second word line and the virtual ground line, and before the operational state being in the row-half-selection state, the second bit line and the first bit line are pre-discharged; and
- when the operational state of the static random access memory cell is in a column-half-selection state, the voltage level of 0 is applied to the first word line, the second word line and the virtual ground line, and the voltage levels of the first bit line and the second bit line are opposite to each other.

* * * * *